(12) United States Patent
Mistretta et al.

(10) Patent No.: US 7,991,452 B2
(45) Date of Patent: *Aug. 2, 2011

(54) CONTRAST ENHANCED MRA WITH HIGHLY CONSTRAINED BACKPROJECTION RECONSTRUCTION USING PHASE CONTRAST COMPOSITE IMAGE

(75) Inventors: Charles A. Mistretta, Madison, WI (US); Julia Velikina, Madison, WI (US); Kevin Michael Johnson, Madison, WI (US); Thomas M. Grist, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 699 days.

This patent is subject to a terminal disclaimer.

(21) Appl. No.: 11/966,237

(22) Filed: Dec. 28, 2007

(65) Prior Publication Data

US 2010/0286504 A1 Nov. 11, 2010

Related U.S. Application Data

(60) Provisional application No. 60/883,099, filed on Jan. 2, 2007.

(51) Int. Cl.
*A61B 5/055* (2006.01)

(52) U.S. Cl. ........ 600/420; 600/410; 600/431; 382/128; 382/130

(58) Field of Classification Search .................. 600/407, 600/410, 428, 420; 382/128; 324/307
See application file for complete search history.

(56) References Cited

U.S. PATENT DOCUMENTS

| | | | |
|---|---|---|---|
| 6,381,486 B1 * | 4/2002 | Mistretta et al. | 600/420 |
| 6,487,435 B2 * | 11/2002 | Mistretta et al. | 600/420 |
| 6,671,536 B2 * | 12/2003 | Mistretta | 600/410 |
| 7,358,730 B2 | 4/2008 | Mistretta et al. | |
| 7,408,347 B2 | 8/2008 | Mistretta et al. | |
| 7,519,412 B2 * | 4/2009 | Mistretta | 600/407 |
| 7,545,901 B2 * | 6/2009 | Mistretta | 378/4 |
| 7,583,992 B2 * | 9/2009 | Mistretta et al. | 600/420 |
| 7,647,088 B2 | 1/2010 | Mistretta et al. | |

(Continued)

FOREIGN PATENT DOCUMENTS

WO 0040989 7/2000

(Continued)

OTHER PUBLICATIONS

Wisconsir Alumni Research Foundation HYPE Portfolio Flow Chart; 3 pages; Jan. 19, 2011.

(Continued)

*Primary Examiner* — Long V Le
*Assistant Examiner* — Farshad Negarestan
(74) *Attorney, Agent, or Firm* — Quarles & Brady LLP

(57) ABSTRACT

Mask projection views are obtained prior to the arrival of a contrast agent during a dynamic contrast enhanced MRA study. After the arrival of the contrast agent, a set of undersampled contrast enhanced projection views are obtained for each of a plurality of time frames. Corresponding mask projection views are subtracted from the contrast enhanced projection views to provide sparse contrast enhanced projection view sets. A phase contrast scan of a region of interest is performed prior to or after the arrival of the contrast agent. The phase contrast image is used as a composite image in a HYPR reconstruction of the sparse projection view sets to produce first pass contrast enhanced images. Iterative HYPR reconstructions can also be performed to remove venous information from the reconstructed images.

18 Claims, 15 Drawing Sheets

U.S. PATENT DOCUMENTS

| | | | |
|---|---|---|---|
| 7,711,166 B2 * | 5/2010 | Mistretta et al. | 382/128 |
| 7,865,227 B2 | 1/2011 | Mistretta et al. | |
| 2001/0027262 A1 | 10/2001 | Mistretta et al. | |
| 2004/0242994 A1 * | 12/2004 | Brady et al. | 600/420 |
| 2007/0038073 A1 | 2/2007 | Mistretta et al. | |
| 2007/0106149 A1 * | 5/2007 | Mistretta | 600/410 |
| 2007/0167707 A1 * | 7/2007 | Mistretta et al. | 600/407 |
| 2007/0167728 A1 | 7/2007 | Mistretta et al. | |
| 2008/0199063 A1 | 8/2008 | Mistretta et al. | |
| 2008/0219535 A1 | 9/2008 | Mistretta et al. | |
| 2009/0076369 A1 | 3/2009 | Mistretta et al. | |
| 2009/0129651 A1 | 5/2009 | Mistretta et al. | |
| 2010/0286504 A1 | 11/2010 | Mistretta et al. | |

FOREIGN PATENT DOCUMENTS

| | | |
|---|---|---|
| WO | 2007037951 A2 | 4/2007 |
| WO | 2007038206 A1 | 4/2007 |

OTHER PUBLICATIONS

J.V. Velikina et al; PC HYPR Flow: A Technique For Rapid Imaging Of Contrast Dynamics; Proc. Intl. Soc. Mag. Reson. Med. 16 (2008); p. 465.

Y. Wu et al; Clinical Experience of HYPR Flow; Proc. Intl. Soc. Mag. Reson. Med. 16 (2008); p. 110.

C. A. Mistretta, et al; Highly Constrained Backprojection for Time-Resolved MRI; Magnetic Resonance In Medicine 55:30-40 (2006).

Tianliang Gu, et al; PC VIPR: A High-Speed 3D Phase-Contrast Method for Flow Quantification and High-Resolution Angiography; AJNR Am J Neuroradiol 26:743-749 (2005).

R. L. O'Halloran, et al; Iterative Reconstruction of Time-Resolved Projection Images Using Highly Constrained Back Projection; Proc. Intl. Soc. Mag. Reson. Med. 15 (2007); p. 3363.

PCT International Search Report; PCT/US2007/089063; 4 pgs.

Wu et al; HYPR-TRICK: Highly Undersampled Hybrid Radial/Cartesian Acquisition with Highly Constrained Backprojection Reconstruction For Time Resolved MRI; Proc. Intl. Soc. Mag. Reson. Med. 14 (2006); 1 page.

Supanich et al; Dose Reduction In Neuro CT Exams Using Highly Constrained Back Projection (HYPR) Techniques; hppt://rsna2006.rsna.org; Nov. 30, 2006; 2 pages.

Mistretta, C.A.; Prospects for Acceleration and Dose Reduction in Selected MR and X-Ray CT Cardiovascular Applications; Proc. Intl. Soc. Mag. Reson. Med. 14 (2006); 1 page.

* cited by examiner

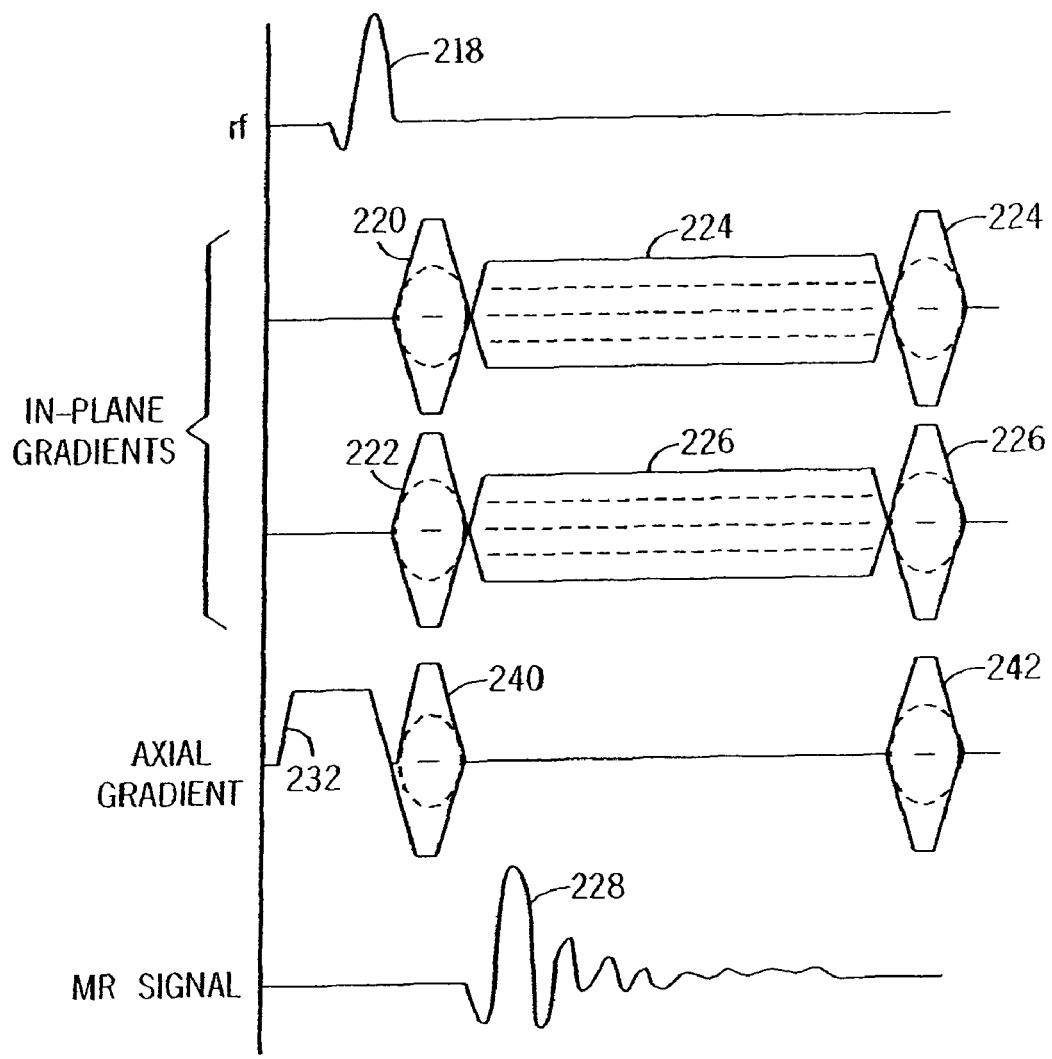

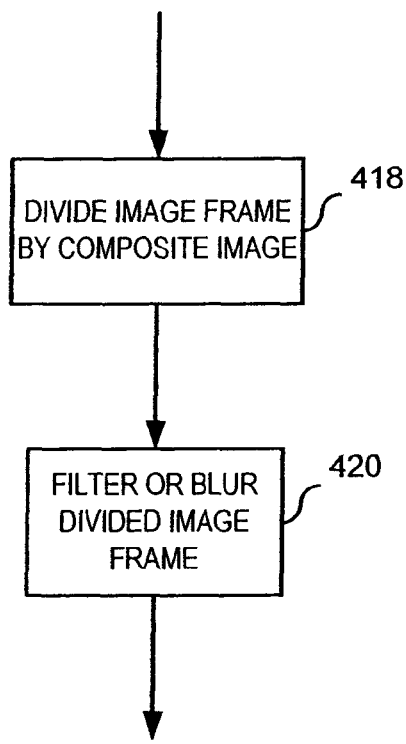
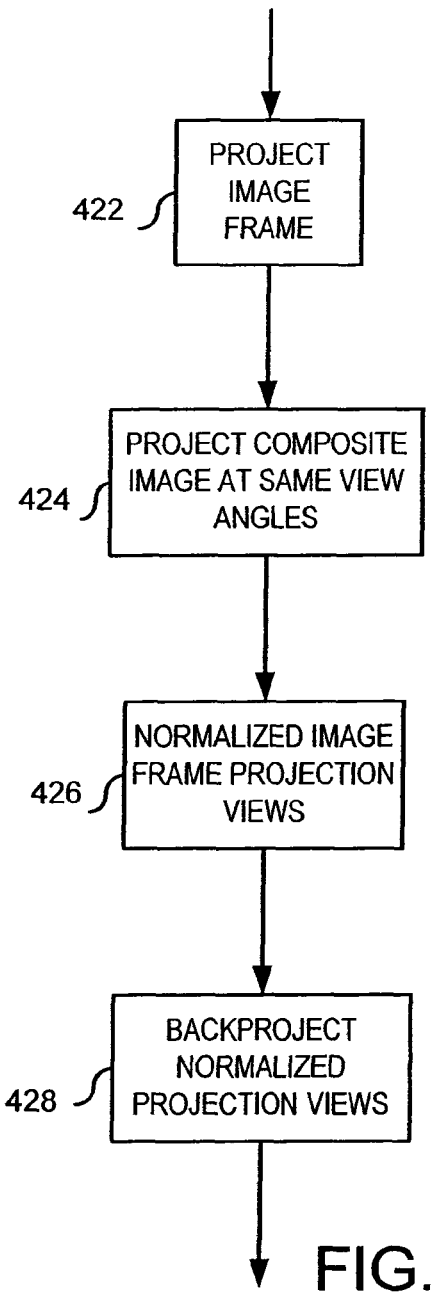
FIG. 10
FIG. 11

US 7,991,452 B2

CONTRAST ENHANCED MRA WITH HIGHLY CONSTRAINED BACKPROJECTION RECONSTRUCTION USING PHASE CONTRAST COMPOSITE IMAGE

CROSS-REFERENCE TO RELATED APPLICATIONS

This application is based on U.S. Provisional Patent Application Ser. No. 60/883,099 filed on Jan. 2, 2007, and entitled "CONTRAST ENHANCED MRA WITH HIGHLY CONSTRAINED BACKPROJECTION RECONSTRUCTION USING PHASE CONTRAST COMPOSITE IMAGE."

STATEMENT REGARDING FEDERALLY SPONSORED RESEARCH

This invention was made with government support under Grant No. NIH HL072260 awarded by the National Institutes of Health. The United States Government has certain rights in this invention.

BACKGROUND OF THE INVENTION

The field of the invention is contrast enhanced magnetic resonance angiography ("CEMRA"), and more particularly, a method for reconstructing CEMRA images from highly undersampled MR data.

Magnetic resonance imaging (MRI) uses the nuclear magnetic resonance (NMR) phenomenon to produce images. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. Each measurement is referred to in the art as a "view" and the number of views determines such factors as the resolution and SNR of the image. The resulting set of received NMR signals, or views, or k-space samples, are digitized and processed to reconstruct the image using one of many well known reconstruction techniques. The total scan time is determined in part by the number of measurement cycles, or views, that are acquired for an image, and therefore, scan time can be reduced at the expense of image resolution or image signal-to-noise ratio ("SNR") by reducing the number of acquired views.

Magnetic resonance angiography (MRA) uses nuclear magnetic resonance phenomenon to produce images of the human vasculature. Two basic MRA techniques have been proposed and evaluated. The first class, time-of-flight (TOF) techniques, consists of methods which exploit the differences in signal saturation that exist between flowing blood and stationary tissue. Flowing blood, which is moving through the excited section, is continually refreshed by spins experiencing fewer excitation pulses and is, therefore, less saturated. This effect is magnified by injecting a contrast agent into the patient and timing the acquisition when the contrast bolus flows through the arteries of interest. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images. Phase contrast MRA techniques have been extended so that they are sensitive to velocity components in all three orthogonal directions, but this requires additional data acquisition.

The most prevalent method for acquiring an NMR data set from which an image can be reconstructed is referred to as the "Fourier transform" imaging technique or "spin-warp" technique. This technique is discussed in an article entitled "Spin-Warp NMR Imaging and Applications to Human Whole-Body Imaging", by W. A. Edelstein et al., *Physics in Medicine and Biology*, Vol. 25, p. 751-756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented in the sequence of views that are acquired during the scan. In a three-dimensional implementation (3DFT) a third gradient ($G_z$) is applied before each signal readout to phase encode along the third axis. The magnitude of this second phase encoding gradient pulse $G_z$ is also stepped through values during the scan. These 2DFT and 3DFT methods sample k-space in a rectilinear pattern such as that shown in FIG. 2A and they require considerable scan time in order to sample k-space adequately.

There has been extensive recent work using multiple receiver coil arrays to shorten imaging scan time. In the SMASH technique described by Griswold, et al., "Simultaneous Acquisition Of Spatial Harmonics (SMASH)" *Magnetic Resonance In Medicine* 1999, June; 41(6):1235-45, multiple coils are carefully positioned in one of the Fourier phase encoding directions. Using knowledge of the coil sensitivities, non-acquired phase encodings can be synthesized, thus increasing the rate at which images of a given resolution can be acquired, or increasing the resolution of images acquired at the same rate. The SENSE technique described by Pruessmann et al., "Coil Sensitivity Encoding for Fast MRI", MRM 42:952-962 (1999) is another such multiple receive channel approach to reducing scan time. The SMASH and SENSE methods are characterized by a factor "R" representing the speed increase over conventional methods on the order of 2 to 3 for a given resolution. They are also characterized by a factor "g", on the order of 1-1.2 representing the increase in noise beyond what would be expected for a given imaging time.

There has also been recent work using projection reconstruction methods for acquiring MRI data as disclosed in U.S. Pat. No. 6,487,435. Projection reconstruction methods have been known since the inception of magnetic resonance imaging. Rather than sampling k-space in a rectilinear scan pattern as is done in Fourier imaging and shown in FIG. 2A, projection reconstruction methods sample k-space with a series of "projections" or views that sample radial lines extending outward from the center of k-space as shown in FIG. 2B. The number of views needed to sample k-space determines the length of the scan and if an insufficient number of views are acquired, streak artifacts are produced in the reconstructed image. The technique disclosed in U.S. Pat. No. 6,487,435 reduces such streaking by acquiring successive undersampled images with interleaved views and sharing peripheral k-space data between successive image frames. This method of sharing acquired peripheral k-space data is known in the art by the acronym "TRICKS".

There are two methods used to reconstruct images from an acquired set of k-space projection views as described, for example, in U.S. Pat. No. 6,710,686. The most common method is to regrid the k-space samples from their locations on the radial sampling trajectories to a Cartesian grid. The image is then reconstructed by performing a 2D or 3D Fourier transformation of the regridded k-space samples in the conventional manner.

The second method for reconstructing an image is to transform the radial k-space projection views to Radon space by Fourier transforming each projection view. An image is reconstructed from these signal projections by filtering and backprojecting them into the field of view (FOV). As is well known in the art, if the acquired signal projections are insufficient in number to satisfy the Nyquist sampling theorem, streak artifacts will be produced in the reconstructed image.

The standard backprojection method is illustrated in FIG. 3. Each Radon space signal projection profile 11 is backprojected into the field of view 13 by projecting each signal sample 15 in the profile 11 through the FOV 13 along the projection path as indicted by arrows 17. In projecting each signal sample 15 in the FOV 13 we have no a priori knowledge of the subject and the assumption is made that the NMR signals in the FOV 13 are homogeneous and that the signal sample 15 should be distributed equally in each pixel through which the projection path passes. For example, a projection path 8 is illustrated in FIG. 3 for a single signal sample 15 in one signal projection profile 11 as it passes through N pixels in the FOV 13. The signal value (P) of this signal sample 15 is divided up equally between these N pixels in a conventional backprojection:

$$S_n = (P \times 1)/N \quad (1)$$

where: $S_n$ is the NMR signal value distributed to the $n^{th}$ pixel in a projection path having N pixels through the FOV 13.

Clearly, the assumption that the NMR signal in the FOV 13 is homogeneous is not correct. However, as is well known in the art, if certain corrections are made to each signal profile 11 and a sufficient number of profiles are acquired at a corresponding number of projection angles, the errors caused by this faulty assumption are minimized and image artifacts are suppressed. In a typical, filtered backprojection method of image reconstruction, 400 projections are required for a 256×256 pixel 2D image and 203,000 projections are required for a 256×256×256 pixel 3D image. If the method described in the above-cited U.S. Pat. No. 6,487,435 is employed, the number of projection views needed for these same images can be reduced to 100 (2D) and 2000 (3D).

The kt-blast technique disclosed by Tsao J., Besinger P. and Pruessman KP, "kt-Blast and k-t Sense: Dynamic MRI with High Frame Rate Exploiting Spatiotemporal Correlations", Magn. Reson. Med. 2003 November; 50(5):1031-43, Hansen M S., Tsao J., Kozerke S., and Eggers H., "k-t Blast Reconstruction From Arbitrary k-t Sampling: Application to Dynamic Radial Imaging", Abstract 684, 2005 ISMRM, Miami Fla., recognizes that in an acquired time series there is a great deal of correlation in the k-space data associated with an acquired set of time frames. In kt-blast, which has been applied to radial acquisitions, a low spatial frequency training data set is acquired to remove the aliasing that occurs when undersampling is performed in the spatial and temporal domains. Using iterative image reconstruction, significant reductions in the required data can be achieved.

An angiographic technique that also incorporates the idea of using a training data set to guide the reconstruction of images using pairs of orthogonal 2D projection images has been described by Huang Y., Gurr D., and Wright G., "Time-Resolved 3D MR Angiography By Interleaved Biplane Projections", Abstract 1707, ISMRM 2005, Miami Fla. In this method an iterative image reconstruction is guided using correlation analysis of data from a training data set that is comprised of all acquired orthogonal 2D projection images.

SUMMARY OF THE INVENTION

The present invention is a new method for reconstructing contrast enhanced magnetic resonance angiography (CEMRA) images which uses an acquired phase contrast image as the composite image in a highly constrained backprojection reconstruction (HYPR), which is also referred to herein as HYPR processing or a HYPR reconstruction. A phase contrast scan on the order of about five minutes generates a phase contrast image that is used as a high quality composite image in the HYPR processing of a contrast enhanced (contrast injection) scan. Reconstructed first pass contrast enhanced images illustrate the inflow dynamics of the contrast agent, and the use of the phase contrast composite image allows unprecedented spatial resolution and SNR relative to what could normally be achieved from a short first pass contrast enhanced scan.

A 2D embodiment of a HYPR reconstruction is pictorially represented in FIG. 4. In general, a composite image provides a priori knowledge for such a reconstruction. Referring to FIG. 4, for example, the signal contour in the field of view 13 may be known to include structures such as blood vessels 19 and 21. That being the case, when the backprojection path 8 passes through these structures a more accurate distribution of the signal sample 15 in each pixel is achieved by weighting the distribution as a function of the known signal contour at that pixel location. With such weighting, a majority of the signal sample 15 will be distributed in the example of FIG. 4 at the pixels that intersect the known structures 19 and 21. For a backprojection path 8 having N pixels this highly constrained backprojection may be expressed as follows:

$$S_n = (P \times C_n) / \sum_{n=1}^{N} C_n. \quad (2)$$

where: $S_n$=the backprojected signal magnitude at a pixel n in an image frame being reconstructed;

P=the signal sample value in the projection profile being backprojected; and $C_n$=signal value of an a priori composite image at the $n^{th}$ pixel along the backprojection path.

The numerator in equation (2) weights each pixel using the corresponding signal value in the composite image and the denominator normalizes the value so that all backprojected signal samples reflect the projection sums for the image frame and are not multiplied by the sum of the composite image. It should be noted that while the normalization can be performed on each pixel separately after the backprojection is performed, in many clinical applications it is far easier to normalize the projection P before the backprojection. In this case, the projection P is normalized by dividing by the corresponding value $P_C$ in a projection through the composite image at the same view angle. The normalized projection $P/P_C$ is then backprojected and the resulting image is then multiplied by the composite image.

A 3D embodiment of the highly constrained backprojection reconstruction is shown pictorially in FIG. 5 for a single 3D projection view characterized by the view angles $\theta$ and $\phi$. This projection view is back projected along axis 17 and spread into a Radon plane 25 at a distance r along the back projection axis 17. Instead of a filtered backprojection in which projection signal values are filtered and uniformly distributed into the successive Radon planes, along axis 17, the projection signal values are distributed in the Radon plane 25 using the information in the composite image. The composite image in the example of FIG. 5 contains vessels 19 and 21. The weighted signal contour value is deposited at image location x, y, z in the Radon plane 25 based on the intensity at the corresponding location x, y, z in the composite image. This is a simple multiplication of the backprojected signal profile value P by the corresponding composite image voxel value. This product is then normalized by dividing the product by the projection profile value from the corresponding image space projection profile formed from the composite image. The formula for the 3D highly constrained reconstruction is $$I(x,y,z)=\Sigma(P(r,\theta,\phi)*C(x,y,z)_{(r,\theta,\phi)}/P_C(r,\theta,\phi)) \quad (2a)$$

where the sum ($\Sigma$) is over all projections in the image frame being reconstructed and the x, y, z values in a particular Radon plane are calculated using the projection profile value $P(r,\theta,\phi)$ at the appropriate $r,\theta,\phi$ value for that plane. $P_C(r,\theta,\phi)$ is the corresponding projection profile value from the composite image, and $C(x,y,z)_{r,\theta,\phi}$ is the composite image value at $(r,\theta,\phi)$.

An important aspect of the invention is the realization that improvements in image quality of HYPR reconstructed contrast enhanced images can be obtained by using a high quality composite image in the HYPR reconstruction, i.e., by using a highly sampled composite image having a high SNR. Thus, performing a phase contrast scan prior to or after the contrast enhanced scan removes the tight time constraints inherent in a conventional contrast enhanced scan and allows many phase contrast views to be obtained over a longer time period (on the order of several minutes) such that the desirable high SNR can be obtained.

Another aspect of the invention is that a phase contrast composite image provides desirable a priori knowledge of the arterial and venous flow in the field of view. The phase contrast image is acquired using a motion encoded pulse sequence that is sensitive to spin motion in the field of view (FOV).

In one embodiment of the inventive method, phase contrast projection views are obtained prior to the arrival of a contrast agent in a dynamic CEMRA scan. The phase contrast projection views are obtained over a relatively long duration and are used to reconstruct a high quality phase contrast image indicative of arterial and venous flow. Mask projection views are also obtained prior to the arrival of the contrast agent and these projection views include information indicative of stationary structure in the field of view. As the contrast agent subsequently flows into the vasculature of interest, a set of highly undersampled contrast enhanced projection views for each of a plurality of time frames are obtained, which include signals indicative of stationary tissues in the field of view along with the enhanced blood signals. Corresponding mask projection views are subtracted from the contrast enhanced projection views to essentially null the signals from unenhanced stationary tissues and to provide a "sparse" contrast enhanced projection view data set for each of the time frames. The reconstructed phase contrast image is then used as a composite image for the highly constrained backprojection reconstruction of each sparse, contrast enhanced projection set. In other words, the phase contrast composite image provides the a priori information for the HYPR processing to reconstruct each image frame from its sparse contrast enhanced projection view set. A variation of this embodiment is to acquire the phase contrast views after the contrast enhanced views are acquired so that residual contrast enhancement is still present in the vasculature.

In another aspect of the invention, iterative HYPR reconstruction can be performed to also remove venous information from the reconstructed images. With the iterative HYPR method the initial reconstructed contrast enhanced image frames are employed as updated composite images and the sparse, contrast enhanced projection data sets undergo the HYPR reconstruction again using these updated composite images. This can be repeated a number of times until the venous information is sufficiently suppressed.

A general object of the invention is to improve the quality of CEMRA images acquired during a dynamic study. A figure of merit F can be defined for accelerated acquisitions as the product of the image volume, the k-space volume and SNR divided by the full-width half-maximum of the temporal impulse response averaged across all spatial frequencies. A figure of merit of 85 is achieved using the present method, where a standard acquisition is taken to be 1.

Yet another novel aspect of this invention is the ability to easily obtain flow direction information from the acquired phase contrast projection views, and to use this flow direction information in the reconstruction of the contrast enhanced image frames. Such flow directional information is normally not provided by CEMRA or DSA scans, but the flow direction information is part of the a priori information in the composite image formed from the motion encoded views.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 6B is a graphic illustration of another preferred pulse sequence for use in practicing the present invention;

FIGS. 9-11 are flow charts of a HYPR method for reconstruction;

DETAILED DESCRIPTION OF THE PREFERRED EMBODIMENT

Figure 1:
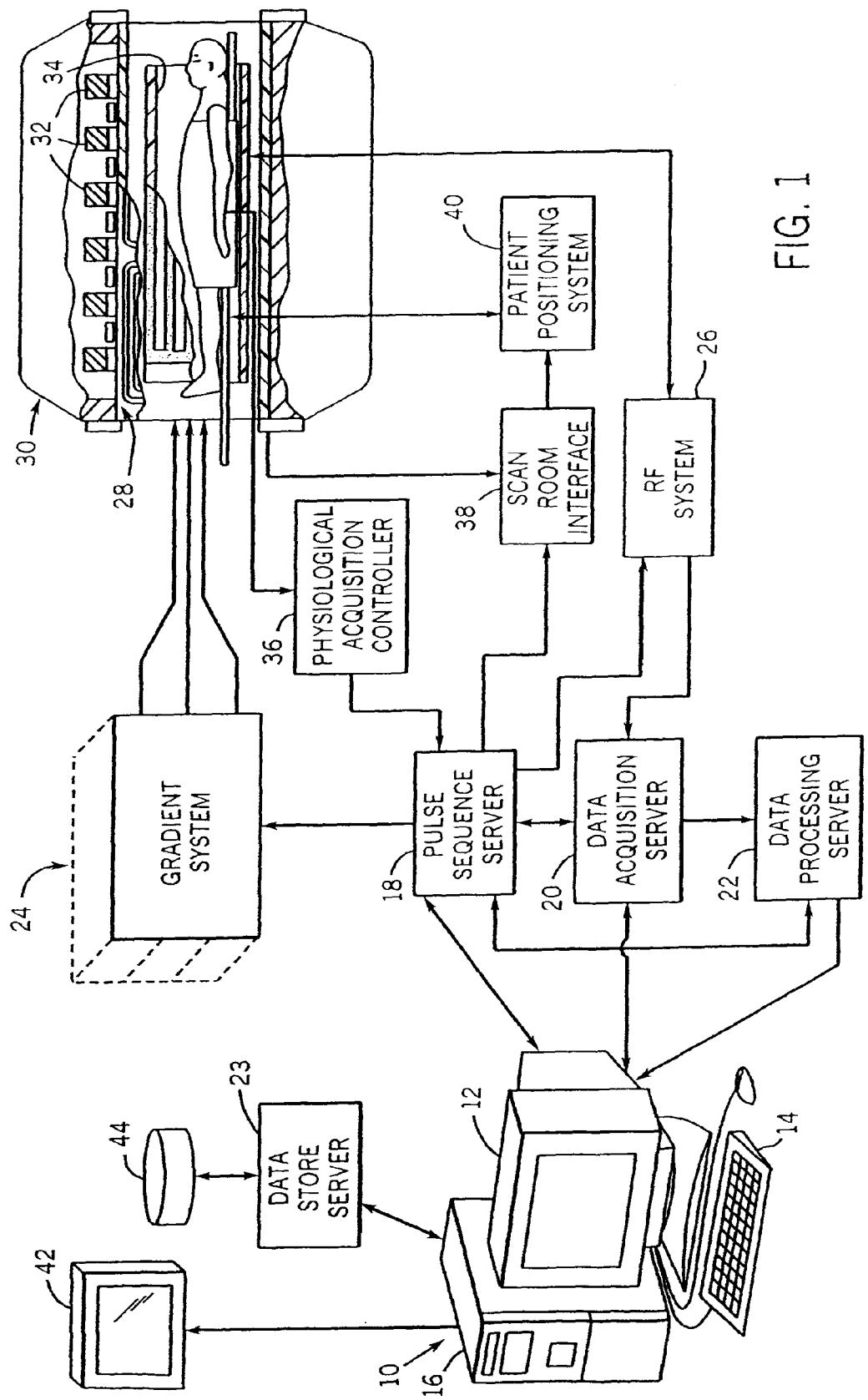
FIG. 1 is a block diagram of an MRI system which employs the present invention.

Referring particularly to FIG. 1, a preferred embodiment of the invention is employed in an MRI system. The MRI system includes a workstation 110 having a display 112 and a keyboard 114. The workstation 110 includes a processor 116 which is a commercially available programmable machine running a commercially available operating system. The workstation 110 provides the operator interface which enables scan prescriptions to be entered into the MRI system.

The workstation 110 is coupled to four servers: a pulse sequence server 118; a data acquisition server 120; a data processing server 122, and a data store server 23. In the preferred embodiment the data store server 123 is performed by the workstation processor 116 and associated disc drive interface circuitry. The remaining three servers 118, 120 and 122 are performed by separate processors mounted in a single enclosure and interconnected using a 64-bit backplane bus. The pulse sequence server 118 employs a commercially available microprocessor and a commercially available quad communication controller. The data acquisition server 120 and data processing server 122 both employ the same commercially available microprocessor and the data processing server 122 further includes one or more array processors based on commercially available parallel vector processors.

The workstation 110 and each processor for the servers 18, 20 and 22 are connected to a serial communications network. This serial network conveys data that is downloaded to the servers 118, 120 and 122 from the workstation 110 and it conveys tag data that is communicated between the servers and between the workstation and the servers. In addition, a high speed data link is provided between the data processing server 122 and the workstation 110 in order to convey image data to the data store server 123.

The pulse sequence server 118 functions in response to program elements downloaded from the workstation 110 to operate a gradient system 124 and an RF system 126. Gradient waveforms necessary to perform the prescribed scan are produced and applied to the gradient system 124 which excites gradient coils in an assembly 128 to produce the magnetic field gradients Gx, Gy and Gz used for position encoding NMR signals. The gradient coil assembly 128 forms part of a magnet assembly 130 which includes a polarizing magnet 132 and a whole-body RF coil 134.

RF excitation waveforms are applied to the RF coil 134 by the RF system 126 to perform the prescribed magnetic resonance pulse sequence. Responsive NMR signals detected by the RF coil 134 are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays.

The RF system 126 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2}$$

and the phase of the received NMR signal may also be determined:

$$\phi=\tan^{-1}Q/I.$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 which receives signals from various sensors associated with the condition of the patient and the magnet system. It is also through the scan room interface circuit 138 that a patient positioning system 140 receives commands to move the patient to desired positions during the scan.

It should be apparent that the pulse sequence server 118 performs real-time control of MRI system elements during a scan. As a result, it is necessary that its hardware elements be operated with program instructions that are executed in a timely manner by run-time programs. The description components for a scan prescription are downloaded from the workstation 110 in the form of objects. The pulse sequence server 118 contains programs which receive these objects and converts them to objects that are employed by the run-time programs.

The digitized NMR signal samples produced by the RF system 126 are received by the data acquisition server 120. The data acquisition server 120 operates in response to description components downloaded from the workstation 110 to receive the real-time NMR data and provide buffer storage such that no data is lost by data overrun. In some scans the data acquisition server 120 does little more than pass the acquired NMR data to the data processor server 122. However, in scans which require information derived from acquired NMR data to control the further performance of the scan, the data acquisition server 120 is programmed to produce such information and convey it to the pulse sequence server 118. For example, during prescans NMR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process NMR signals used to detect the arrival of contrast agent in an MRA scan. In all these examples the data acquisition server 120 acquires NMR data and processes it in real-time to produce information which is used to control the scan.

The data processing server 122 receives NMR data from the data acquisition server 120 and processes it in accordance with description components downloaded from the workstation 110. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc. As will be described in more detail below, the present invention is implemented by the MRI system in response to a program executed by the data processing server 122.

Images reconstructed by the data processing server 122 are conveyed back to the workstation 110 where they are stored. Real-time images are stored in a data base memory cache (not shown) from which they may be output to operator display 112 or a display 142 which is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

To practice some of the preferred embodiments of the invention NMR data is acquired in a 3D spherical k-space coordinate system, with the readout gradient direction defined by the angle θ from the $k_z$-axis and by the angle φ from the $k_y$-axis. The sampling method consists of a series of equally spaced projections with all projections going through the center of k-space. The maximum k-space radius value ($k_{max}$) determines the resolution in all three spatial directions of the resulting image. The radial sample spacing ($\Delta k_r$) determines the diameter (D) of the full field of view (FOV) of the reconstructed image. The full FOV image may be reconstructed without artifacts if the Nyquist condition is met.

Figure 6A:
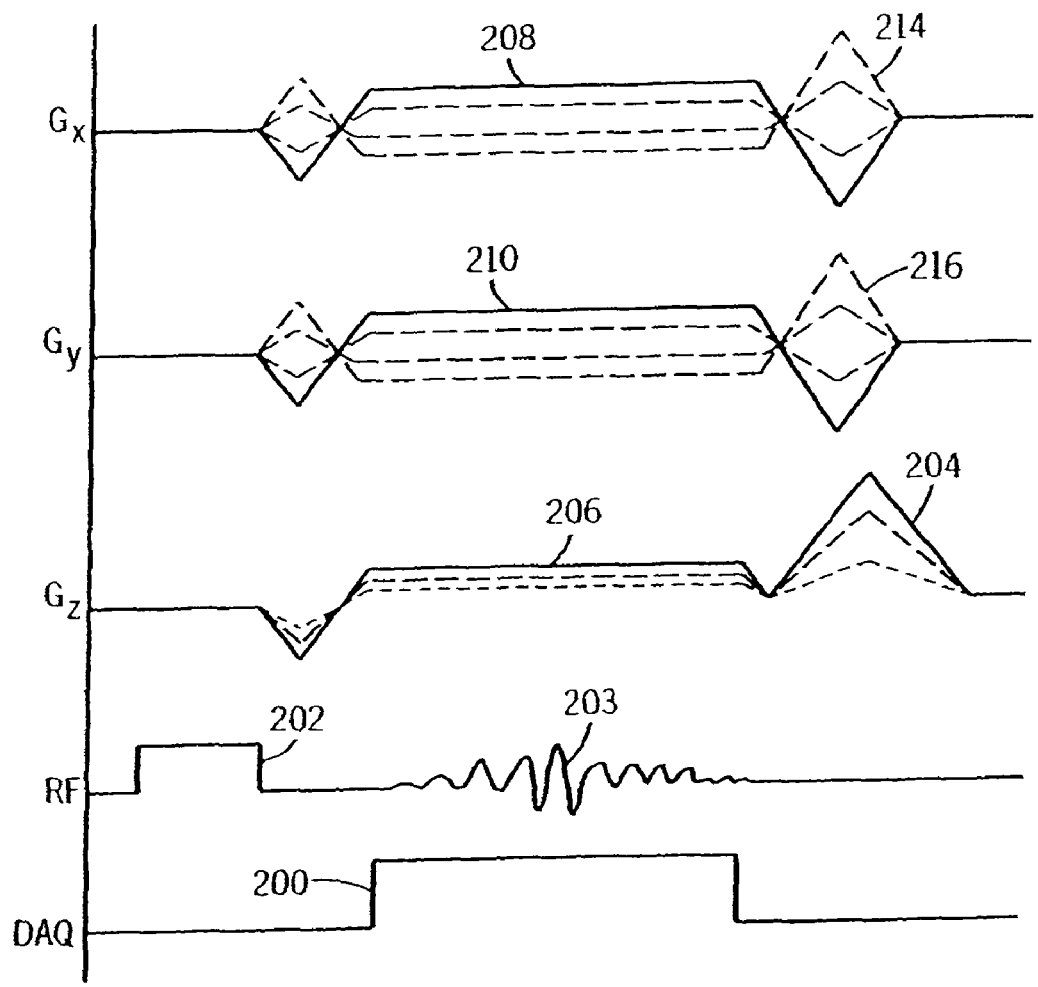
FIG. 6A is a graphic illustration of a preferred pulse sequence for directing the MRI system of FIG. 1 to acquire 3D radial projection views.

A pulse sequence used to acquire data as 3D radial projections is shown in FIG. 6A. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space ($k_z$<0) is only partially acquired. Because of the large FOV in all directions, a non-selective radio-frequency (RF) pulse 202 can be used to produce transverse magnetization throughout the image FOV.

A gradient-recalled NMR echo signal 203 is produced by spins in the excited FOV and acquired in the presence of three readout gradients 206, 208 and 210. Since a slab-select gradient is not required, the readout gradient waveforms $G_x$, $G_y$, and $G_z$ have a similar form. This symmetry is interrupted only by the need to spoil the sequence, which is accomplished by playing a dephasing gradient lobe 204. The $G_x$ and $G_y$ readout gradients 208 and 210 are rewound by respective gradient pulses 212 and 214 to achieve steady state.

The readout gradient waveforms $G_x$, $G_y$ and $G_z$ are modulated during the scan to sample radial trajectories at different angles. The angular spacing is chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For N total projections, the equations for the gradient amplitude as a function of projection number n are:

$$G_z = \frac{2n-1}{2N} \tag{3}$$

$$G_x = \cos\left(\sqrt{2N\pi}\sin^{-1}G_z(n)\right)\sqrt{1-G_z(n)^2} \tag{4}$$

$$G_y = \cos\left(\sqrt{2N\pi}\sin^{-1}G_z(n)\right)\sqrt{1-G_z(n)^2}. \tag{5}$$

The readout gradient amplitudes for the $n^{th}$ pulse sequence in this series is given by equations (3), (4) and (5). While n can be indexed from 1 to N in monotonic order during the scan, it can be appreciated that other orders are possible. As will be described below, the present invention enables the spherical k-space to be sampled with far fewer projection views, which results in a shorter scan time.

Another pulse sequence used to practice a number of embodiments of the present invention is shown in FIG. 6B. This is a fast gradient-recalled echo pulse sequence in which a selective, asymmetrically truncated sinc rf excitation pulse 218 is produced in the presence of a slab-select gradient 232. The flip angle of the rf pulse 218 is set near the Ernst angle for $T_1$ shortened blood which is typically 30° to 40°.

Figure 6C:
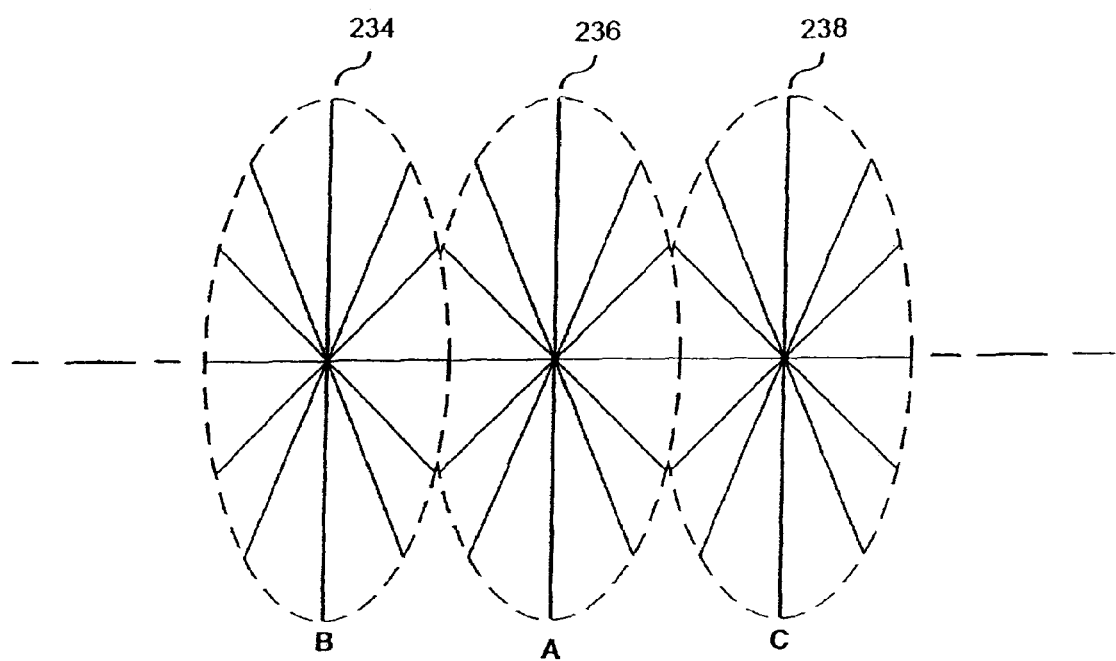
FIG. 6C is a pictorial representation of the k-space sampling pattern performed with the pulse sequence of FIG. 6B.

This pulse sequence may be used to acquire a single 2D slice by sampling in a single k-space circular slice, or it may be used to sample a plurality of circular k-space slices as shown at 234, 236 and 238 in FIG. 6C. When multiple 2D slices are acquired the axial gradient produces the slab select gradient 232 followed by a phase encoding gradient lobe 240 and a rewinder gradient lobe 242 of opposite polarity. This axial phase encoding gradient 240 is stepped through values during the scan to sample from each of the 2D k-space slices 234, 236 and 238. It should be apparent that any number of 2D k-space slices may be sampled with this pulse sequence by applying a corresponding number of different axial phase encodings.

Two in-plane readout gradients 224 and 226 are played out during the acquisition of an NMR echo signal 228 to sample k-space in a 2D plane 234, 236 or 238 along a radial trajectory. These in-plane gradients 224 and 226 are perpendicular to the axial gradient and they are perpendicular to each other. During a scan they are stepped through a series of values to rotate the view angle of the radial sampling trajectory. Each of the in-plane readout gradients is preceded by a prephasing gradient lobe 220 and 222 and followed by a rewinder gradient lobe 224 and 226. For each axial phase encoding 240, a complete set of radial projection views are acquired to sample the 2D k-space slice. As will be described below, the present invention enables these 2D k-space slices to be sampled with fewer radial projection views, which results in a shorter scan time.

To further shorten scan time it is also possible to acquire more than one radial trajectory during the performance of each 2D or 3D pulse sequence. Such a method is disclosed, for example, in U.S. Pat. Nos. 7,148,685 and 6,794,867 where the readout gradient waveforms are shaped to sample along two to four different radial trajectories during a single pulse sequence. Another option is to shorten the radial scan trajectory to further reduce scan time for each image frame. Although this reduces the resolution of the acquired image frames, the resolution is restored by the HYPR reconstruction process discussed below via the high resolution phase contrast composite image.

It should be apparent to those skilled in the art that sampling trajectories other than the preferred straight line radial trajectory extending from one point on the k-space peripheral boundary, through the center of k-space to an opposite point on the k-space peripheral boundary may be used. As mentioned above, one variation is to acquire a partial NMR echo signal 228 which samples along a trajectory that does not extend across the entire extent of the sampled k-space volume. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. It should also be apparent that the present invention may be employed with 2D as well as 3D versions of these sampling methods and references herein to the term "pixel" as used hereinafter is intended to refer to a location in either a 2D or a 3D image. In addition, other k-space sampling trajectories may be employed such as Cartesian, PROPELLER and Shell trajectories. It is more convenient from a processing standpoint to employ the same k-space sampling trajectory for both the composite image and the contrast enhanced image frames, but this is not necessary. As long as the k-space samples corresponding to those employed in the contrast enhanced image frames can be obtained from the composite image, it will work.

The present invention is an improved method for reconstructing contrast enhanced images. The method requires obtaining a composite image of the FOV prior to the time the contrast enhanced images are acquired. The manner in which this composite image is acquired and used is described below.

Figure 7:
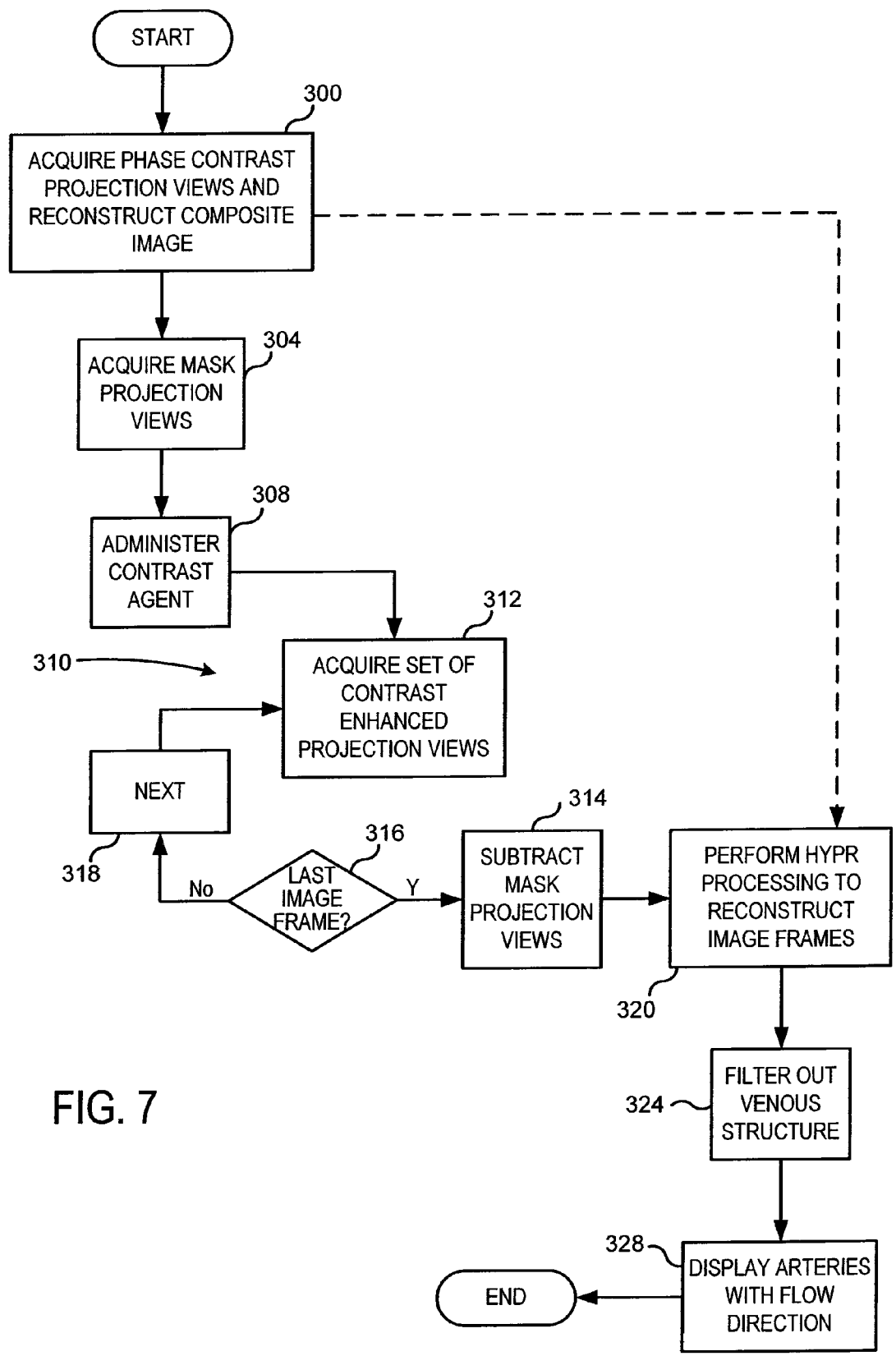
FIG. 7 is a flow chart of one preferred method for employing the present invention in an MR imaging application.

Referring particularly to FIG. 7, a first preferred embodiment is applicable to CEMRA imaging in which a time-resolved series of images is acquired on a near real-time basis. The first step in the procedure is to acquire a plurality of phase contrast projection views and reconstruct a phase contrast composite image of the subject throughout the prescribed field of view (FOV) as indicated at process block 300. The phase contrast projection views are obtained prior to injection of the contrast agent as part of the CEMRA scan and k-space projection views are acquired over a relatively long duration, on the order of about five minutes. Because the duration of the phase contrast scan is not a major concern, many projection views can be acquired, and preferably, enough data is acquired to satisfy the Nyquist criteria and produce an image of the desired resolution without significant streak artifacts.

Figure 2A:
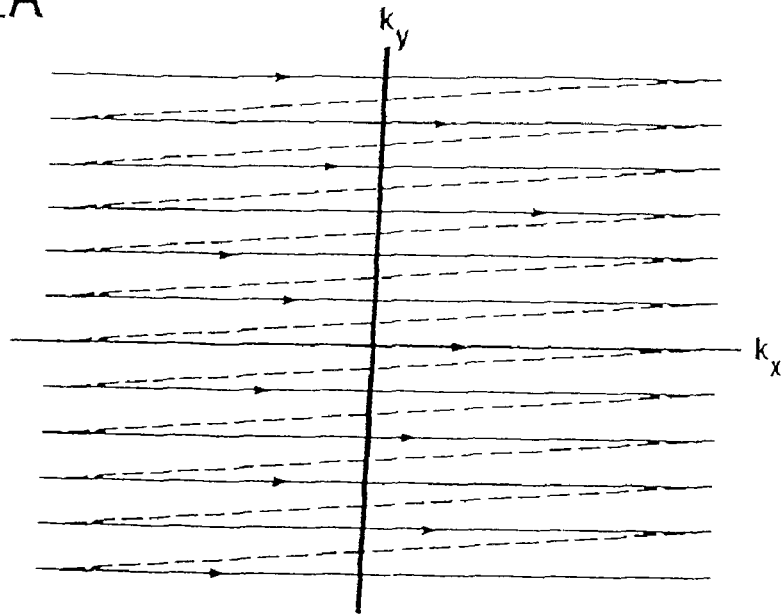
FIG. 2A is a graphic illustration of the manner in which k-space is sampled during a typical Fourier, or spin-warp, image acquisition using the MRI system of FIG. 1.
Figure 2B:
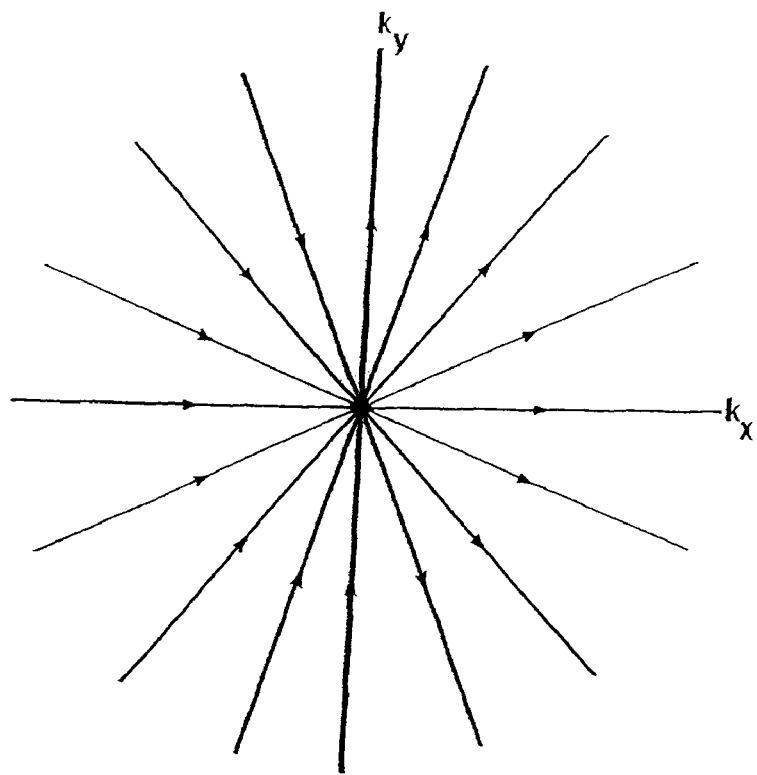
FIG. 2B is a graphic illustration of the manner in which k-space is sampled during a typical projection reconstruction image acquisition.
Figure 3:
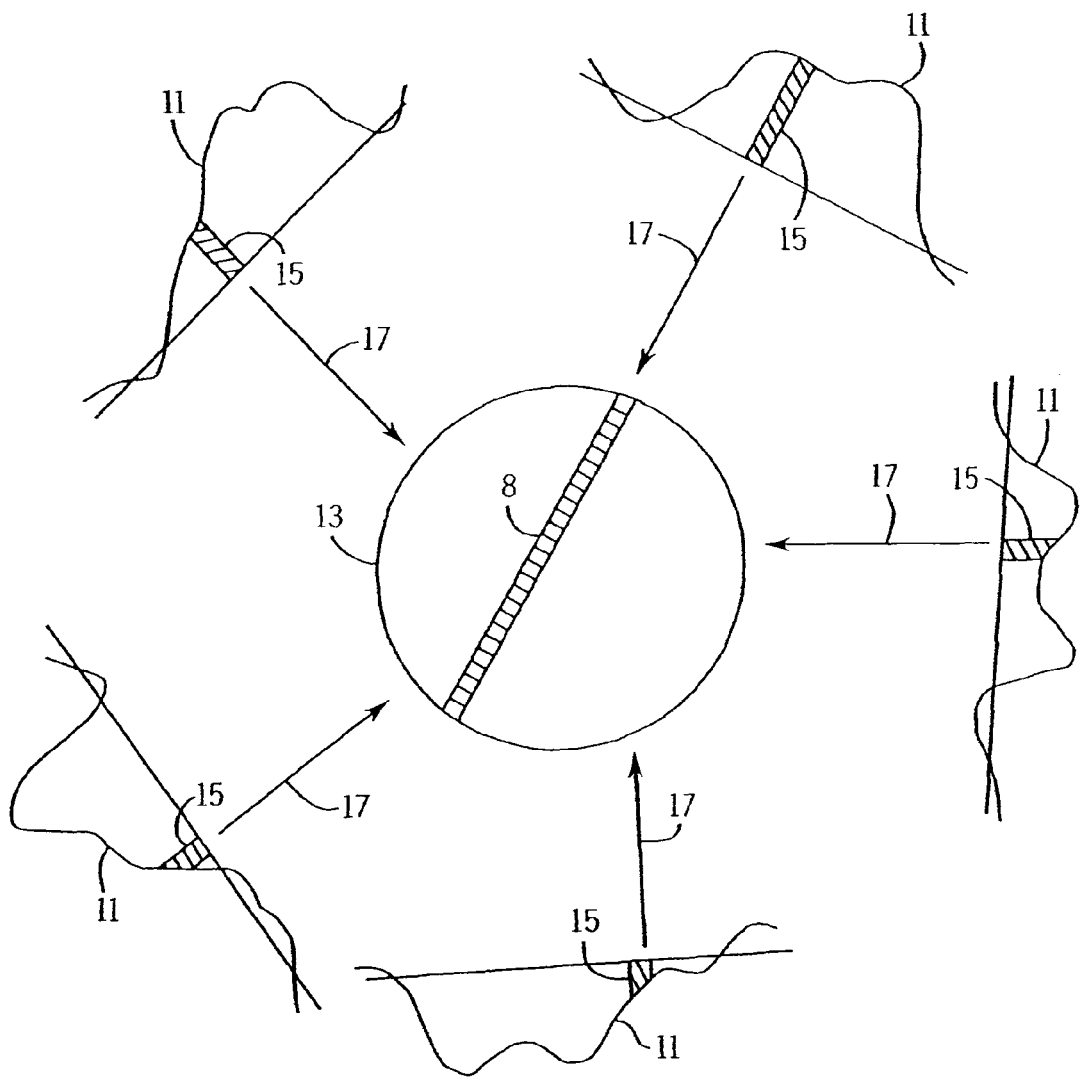
FIG. 3 is a pictorial representation of a conventional backprojection step in an image reconstruction process.
Figure 4:
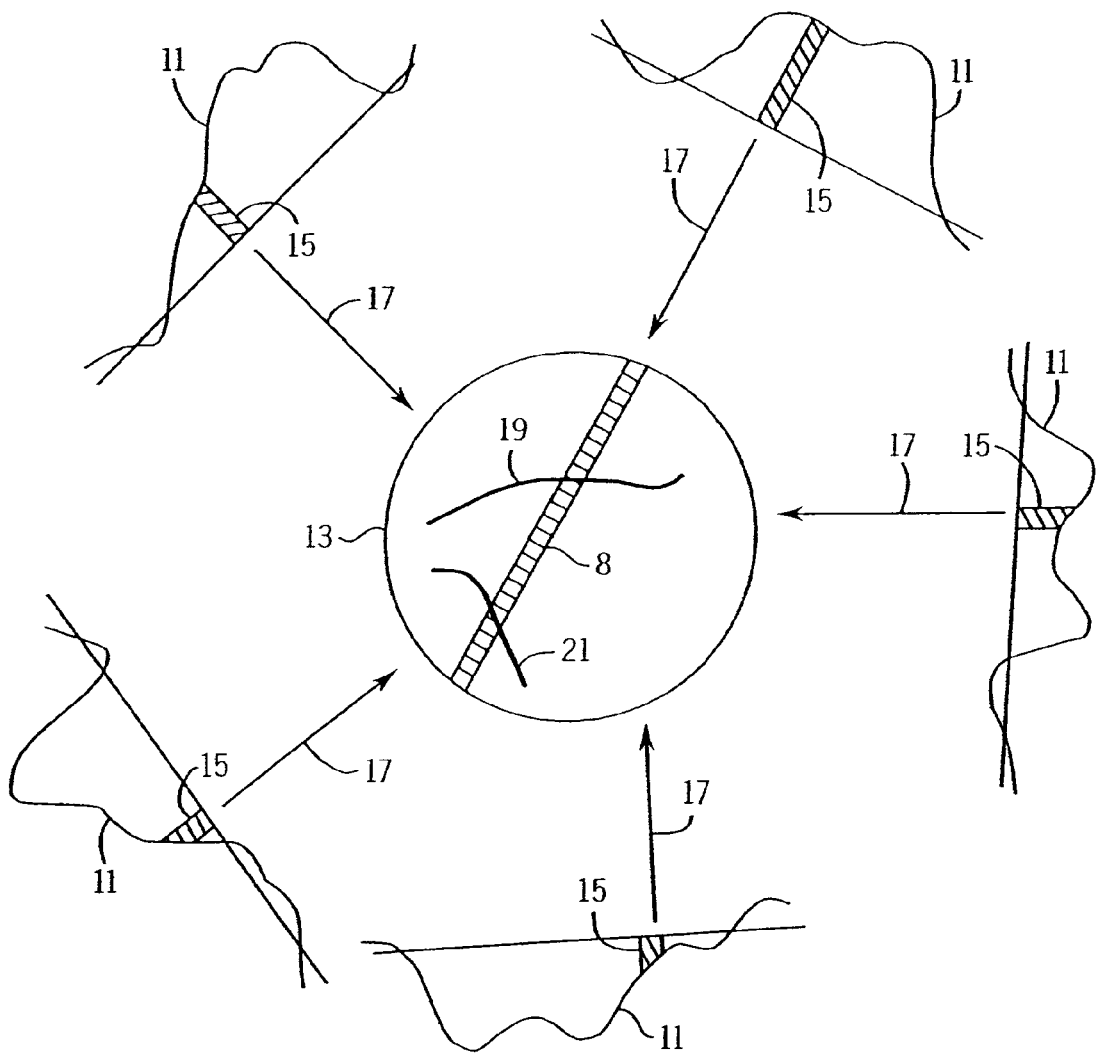
FIG. 4 is a pictorial representation of a 2D embodiment of a highly constrained backprojection reconstruction.
Figure 5:
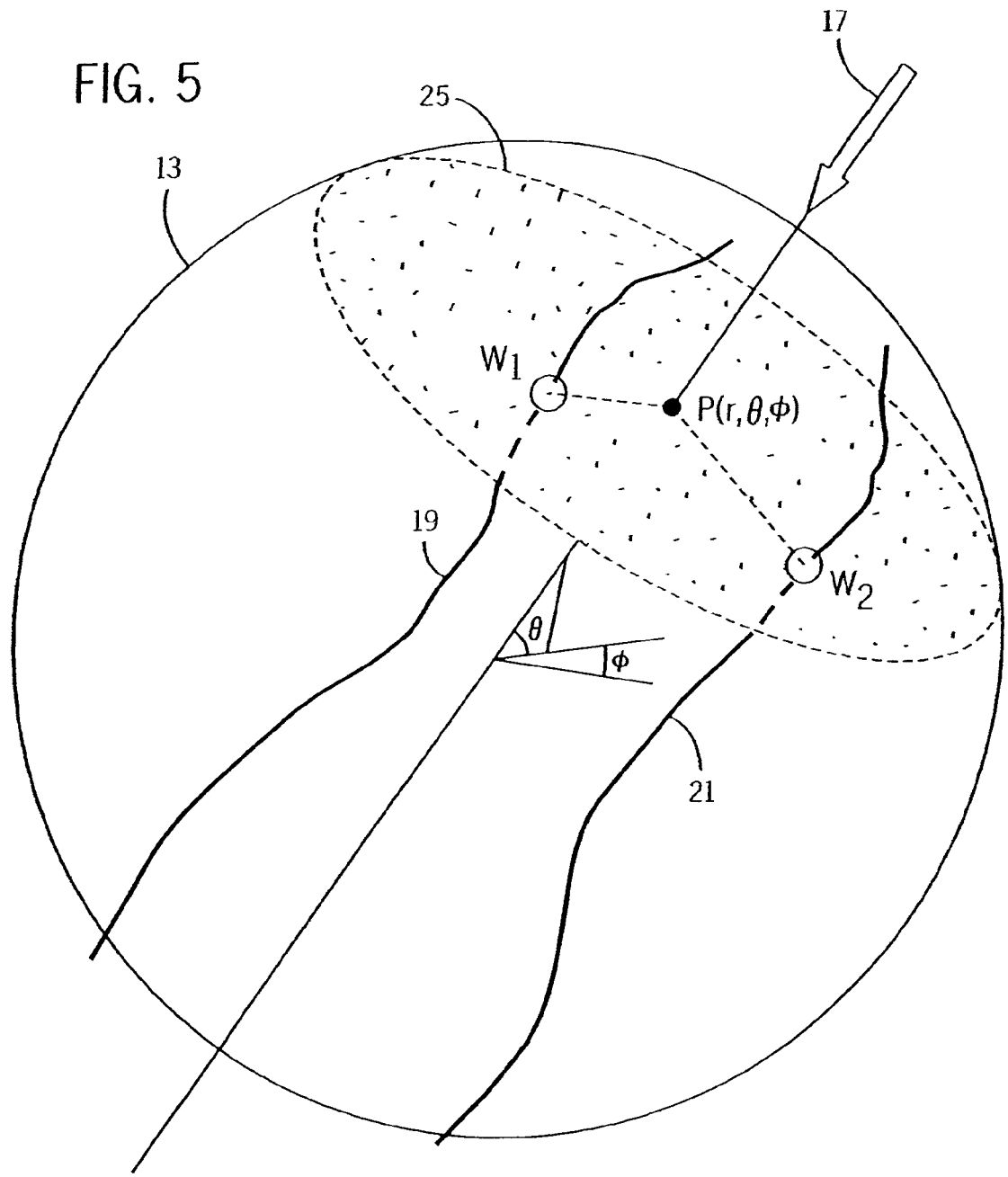
FIG. 5 is a pictorial representation of a 3D embodiment of a highly constrained backprojection reconstruction.

In a preferred embodiment, a pulse sequence known as PC VIPR, and described in U.S. Pat. No. 6,954,067 (hereby incorporated by reference) is used to obtain 3D radial k-space projection views. Other phase contrast pulse sequences can also be used to acquire projection views in other k-space geometries such as the so-called 2.5D geometry illustrated in FIG. 5 or such as a 2D radial geometry like that illustrated in FIG. 2B and described in U.S. Pat. No. 6,188,922. If subject motion due to respiration or the cardiac cycle is an issue, the acquisition of the phase contrast projections may be gated. The gating may be triggered by a respiratory gating signal or cardiac gating signal or both, depending on the subject being examined.

The reconstruction of the phase contrast image to be used as a composite image in a HYPR reconstruction can be performed using the techniques described in U.S. Pat. Nos. 6,954,067 and 6,188,922 and can use a conventional reconstruction method. The reconstructed phase contrast image indicates the magnitude of the spin velocity at each image pixel throughout the 2D or 3D FOV and is indicative of arterial and venous flow. This phase contrast image provides a priori information about the subject of the scan. Maps of spin velocity in any of the three x, y, z axes (or an arbitrary axes) can also be generated. The phase contrast image of spin velocity provides an accurate depiction of the subject's vasculature due to the moving blood.

As indicated at process block 304, a mask image is also acquired prior to the arrival of the contrast agent in the FOV. The mask projection views are acquired using the same radial scan geometry as the phase contrast projection views and the subsequently acquired contrast enhanced projection views. In a preferred embodiment, mask projection views that radially sample 3D k-space in a uniform manner are obtained using a pulse sequence such as that shown in FIG. 6A and described above. Further, the mask projection views are obtained at each of the projection angles used in the subsequently acquired undersampled contrast enhanced scan. The mask projection views provide anatomical information indicative of stationary tissues in the field of view.

As indicated at process block 308, a contrast agent is injected into the subject. It is not necessary that this injection be performed after all phase contrast and mask projection views are acquired as described above, as long as these steps are performed before the contrast agent flows into the FOV. As the contrast agent flows into the vasculature of interest, a set of highly undersampled contrast enhanced projection views for each of a plurality of time frames are obtained as indicated generally at 310. Each contrast enhanced projection view set is acquired as rapidly as possible as indicated at process block 312 and the time frames are acquired preferably during a first pass: i.e., at a time that contrast agent remains in arterial structures prior to traveling to the venous structures. In one embodiment, 8-12 projections are acquired for each time frame and in the preferred 3D embodiment 110 to 160 projection views are acquired. The projection view sets are acquired as indicated at process block 318 until the last image time frame is acquired as indicated at decision block 316. These projection view data sets provide information regarding the in flow of contrast enhanced blood as well as tissues stationary in the field of view.

A pulse sequence similar to that used to acquire the mask projection views is used to acquire the contrast enhanced projection views. A preferred embodiment samples k space using radial 3D trajectories using a pulse sequence such as that described above and shown in FIG. 6A. The number and angle of the mask projection views acquired corresponds to those acquired during the contrast enhanced image frame acquisition. Further, the contrast enhanced projection views acquired for different time frames are distributed evenly throughout k-space and are interleaved with respect to one another. That is, each time frame will comprise projection views acquired at a subset of the view angles used to acquire the mask projection views and the view angles will be different for each time frame. If gating is used during acquisition of the composite image, then the same gating method is used to acquire the contrast enhanced projection views.

As indicated at process block 314, the mask projection views are then subtracted from the contrast enhanced projection views. For each time frame set of contrast enhanced projection views, corresponding mask projection views acquired at the same view angles are subtracted from the contrast enhanced projection views to produce a sparse contrast enhanced projection view image frame data set. This is done so that data representing non-vascular, stationary tissues are removed. Each resulting sparse projection view data set is then used, along with the high quality phase contrast composite image to perform a HYPR image reconstruction indicated at process block 320.

Figure 9:
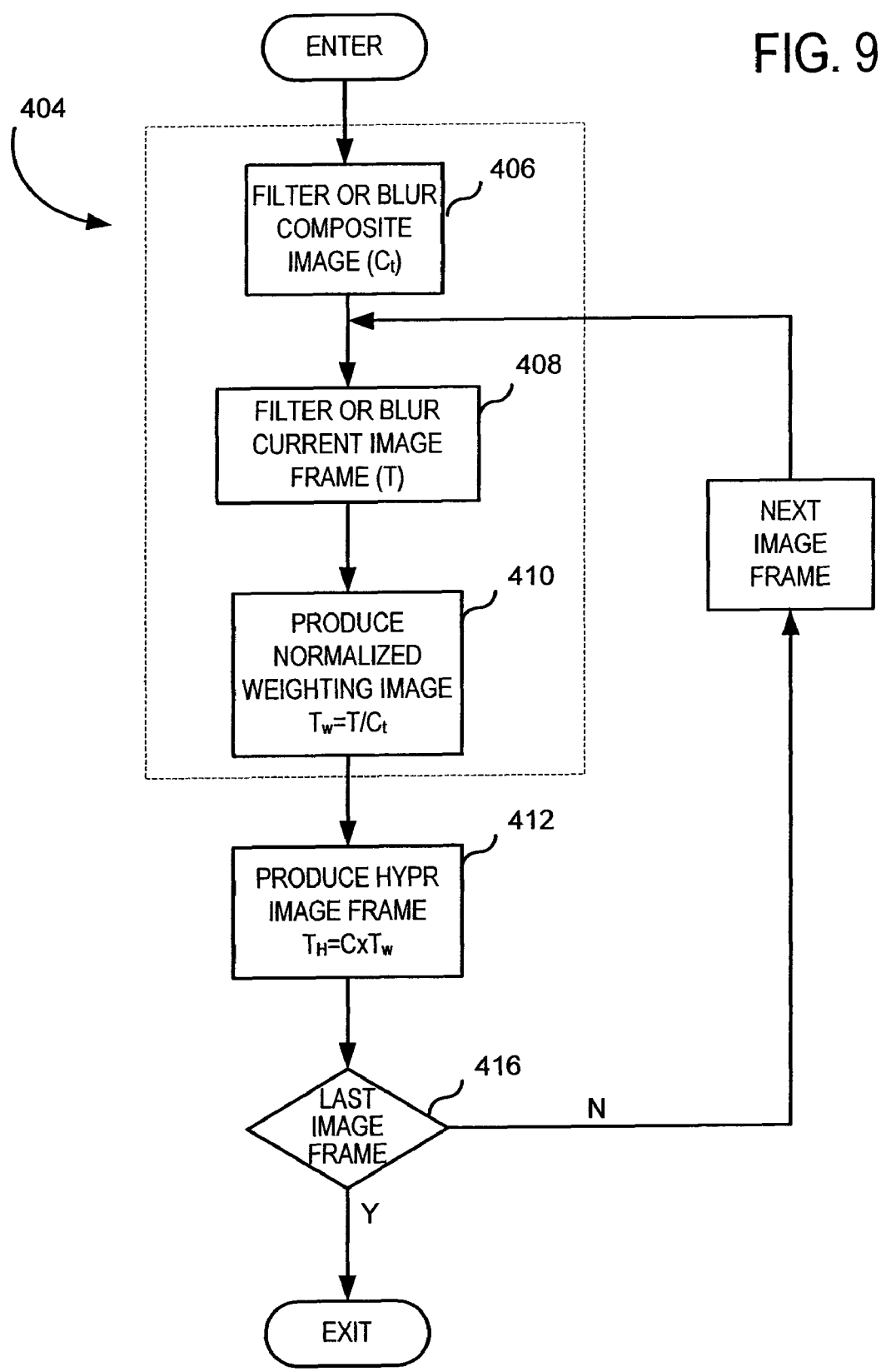

Referring particularly to FIG. 9, the image frames are reconstructed using the "local" version of HYPR described in co-pending U.S. patent application. Ser. No. 60/901,728 filed on Feb. 19, 2007, and entitled "Localized and Highly Constrained Image Reconstruction Method," which is incorporated herein by reference. As indicated generally at 404, the first step is to produce a normalized weighting image using the current image frame and the composite image. There are a number of different ways to perform this step and the preferred method is shown in FIG. 9. More specifically, the composite image is "blurred" by filtering as indicated at process block 406. The filtering is a convolution process in which the composite image array is convolved with a filter kernel. The kernel size should be selected so that when the blurring is done the kernel does not include much information from outside the subject of interest (for example a blood vessel). If the filter kernel is much larger than the subject of interest, the magnitude of the signal therein may be averaged, but its shape is not changed. On the other hand, if the filter kernel is smaller than the subject of interest, its shape, or profile, may be blurred. The current image frame is also reconstructed and blurred or filtered in the same manner as indicated at process block 408. That is, the reconstructed image frame array is convolved with the filter kernel to perform a low pass filtering function. As indicated at process block 410, a normalized weighting image ($T_W$) is then produced by dividing pixel values in the filtered current image frame (T) by the corresponding pixel values in the filtered composite image ($C_t$). In this embodiment each image frame is reconstructed from a sparse contrast enhanced projection view image frame data set using a conventional method such as a filtered back projection.

As indicated at process block 412, a highly constrained (HYPR) image frame is then produced. This image frame is produced by multiplying the composite image array by the normalized weighting image array ($T_W$). This is a multiplication of corresponding pixel values in the two images. The resulting HYPR image is saved and the system loops back as indicated at process block 414 to acquire and process the next image frame. When the procedure is completed, as determined at decision block 416, the HYPR reconstruction process 320 ends.

There are a number of alternative methods for producing the normalized weighting image ($W_T$). Two of these methods are illustrated in FIGS. 10 and 11. Referring particularly to FIG. 10, the first alternative method includes a first step indicated at process block 418 of dividing the acquired image frame array by the composite image. This is a division of every pixel value in the acquired image frame array by the corresponding pixel value in the composite image array. The resulting divided image frame is then blurred or filtered as indicated at process block 420 to produce the normalized weighting image ($T_W$). This filtering operation is the same convolution process discussed above with respect to process blocks 406 and 408.

Another alternative method for producing the normalized weighting image ($T_W$) is illustrated in FIG. 11. This method employs the sparse contrast enhanced image frame projection views as indicated at process block 422. As indicated at process block 424, the phase contrast composite image is transformed to Radon space by calculating projection views at the same set of view angles used in the image frame. As indicated at process block 426 the sparse contrast enhanced image frame projection views P are then normalized by dividing them by the phase contrast composite image projection views $P_C$. This is a division of corresponding elements in the projections P and $P_C$ at the same view angle. The normalized weighting image ($T_W$) is then produced at process block 428 by back projecting the normalized projections ($P/P_C$) in a conventional manner. This is not a filtered backprojection, but a straight forward backprojection.

Figure 12:
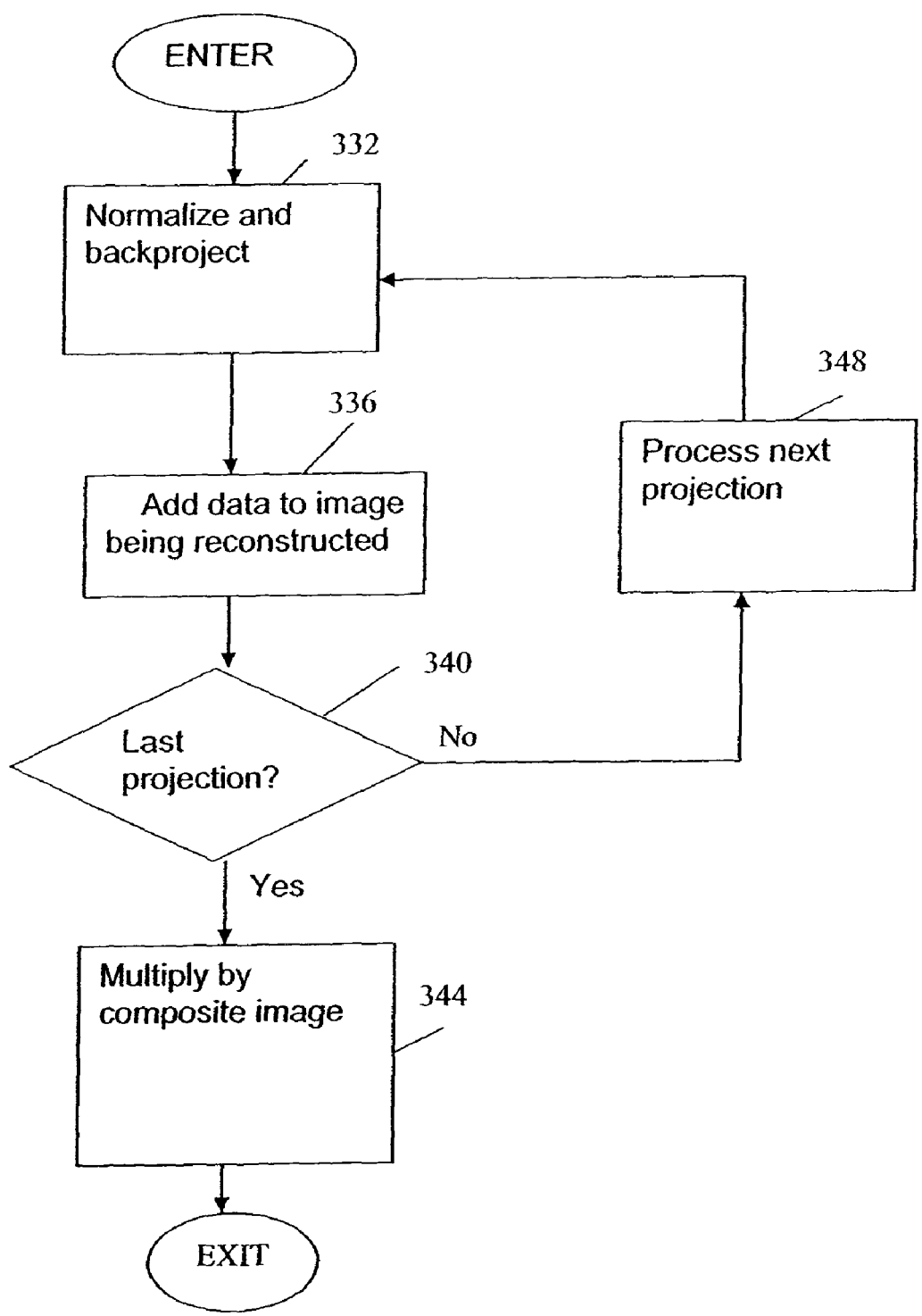
FIG. 12 is a flow chart of an alternative HYPR method for reconstruction.

Another embodiment of a HYPR reconstruction method is illustrated in FIG. 12, where each of the contrast enhanced image frames is reconstructed using their respective sparse contrast enhanced projection data sets and the phase contrast composite image. This highly constrained backprojection reconstruction is described above with respect to equation (2a) and is shown pictorially in FIG. 5. More particularly, the projections are normalized as indicated at process block 332 and the normalized projection is then backprojected into the FOV. This is a standard backprojection, but with no filtering. As indicated at process block 336, the resulting backprojected values are added to the image frame being reconstructed, and a test is made at decision block 340 to determine if all the projection views for the current image frame have been backprojected. If not, the next projection view is backprojected as indicated at process block 348. When all the projection views have been backprojected and summed for an image frame, the summed image frame is multiplied by the phase contrast composite image as indicated at process block 344. This is a matrix multiplication in which the pixel value in the image frame is multiplied by the value of the corresponding pixel in the composite image.

It should be apparent that other methods for performing this highly constrained image frame reconstruction may be also be used as described in co-pending U.S. patent application. Ser. No. 11/482,372, filed on Jul. 7, 2006 and entitled "Highly Constrained Image Reconstruction Method", and which is incorporated herein by reference, or as described in co-pending U.S. patent application Ser. No. 11/482,857, also filed on Jul. 7, 2006, and entitled "Backprojection Reconstruction Method For Undersampled Time Resolved MR Imaging", which is also incorporated herein by reference. All image frames are reconstructed in the same fashion.

Registration of the composite image with the image frames produced from the sparse contrast enhanced projection view sets is assumed in the above described method. If necessary, a separate registration step can be performed. A number of methods are known in the art for registering two images and in one preferred embodiment the method described in the PhD thesis of Oliver Wieben published by the University of Wisconsin in 2002 and entitled "Novel Acquisition Strategies For Time Resolved 3D, Magnetic Resonance Angiography" is employed.

Figure 13:
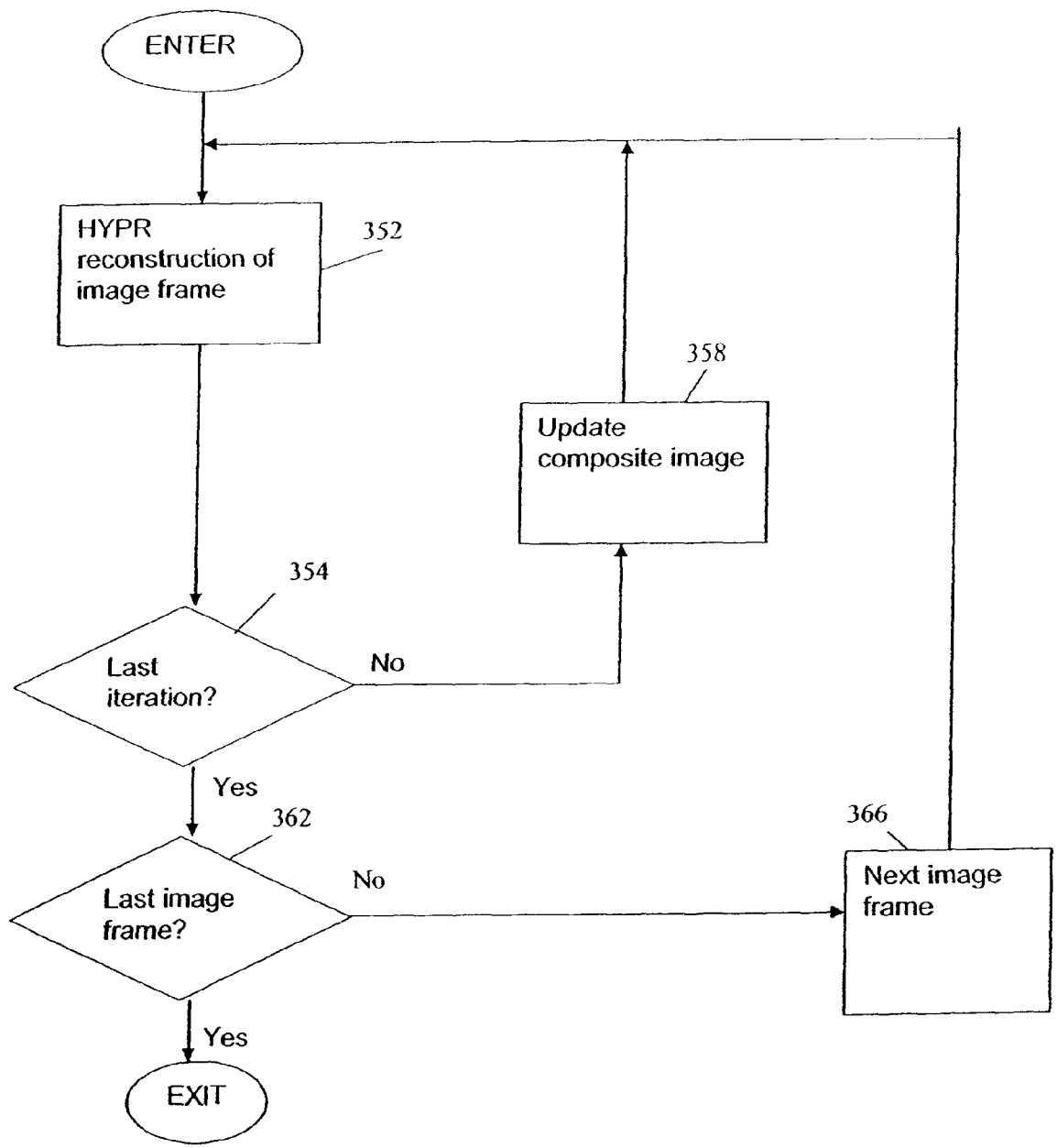
FIG. 13 is a flow chart of a preferred method for filtering out venous structure.

Referring back to FIG. 7, as indicated by process block 324, venous structures can be filtered out of the resulting image frames by an iterative type HYPR method such as that described in U.S. Provisional Appln. Ser. No. 60/901,727, filed on Feb. 19, 2007 and entitled "Iterative Highly Constrained Image Reconstruction Method". Referring to FIG. 13, at process blocks 352, 354, and 358, a series of HYPR reconstructions are performed using the sparse contrast enhanced projections of the current time frame and a phase contrast composite image which is updated after each HYPR reconstruction. If the venous signals are absent or suppressed in the acquired contrast enhanced projections, the veins will disappear from the iterated HYPR images. As indicated at process blocks 362 and 366, all projection view sets are processed in this iterative manner to produce all image frames.

Referring back to FIG. 7, as indicated at process block 328, the image of flow direction generated from the phase contrast scan can also be used to indicate blood flow direction in the reconstructed contrast enhanced time frame images. For example, the blood flow direction information at each image pixel is used to color code the corresponding pixel in the contrast enhanced time frame image. Other parametric information may also be calculated from the phase contrast image data and displayed on the CEMRA time frame images, such as pressure gradient information. These flow parameters provide unique information that has not previously been available in a first pass examination and should be very helpful in evaluating retrograde flow. For example, the hemodynamic significance of stenotic lesions identified on the contrast-enhanced images may be calculated from the velocity information. Pressure gradients may be estimated from the velocity information using the Navier-Stokes equations. The blood flow velocity in each motion encoded direction may be used to generate corresponding masks that are each multiplied by the image frame to produce corresponding color images. The two or three color images are then combined to form a single color image in which the color of each pixel indicates flow direction.

In the CEMRA method depicted in FIG. 7 the image frames can be reconstructed and displayed in near real-time as the dynamic study is performed. This is possible because the composite image is acquired and reconstructed prior to the dynamic study. An alternative CEMRA method is one in which all the image frames are acquired before image reconstruction is performed.

Figure 8:
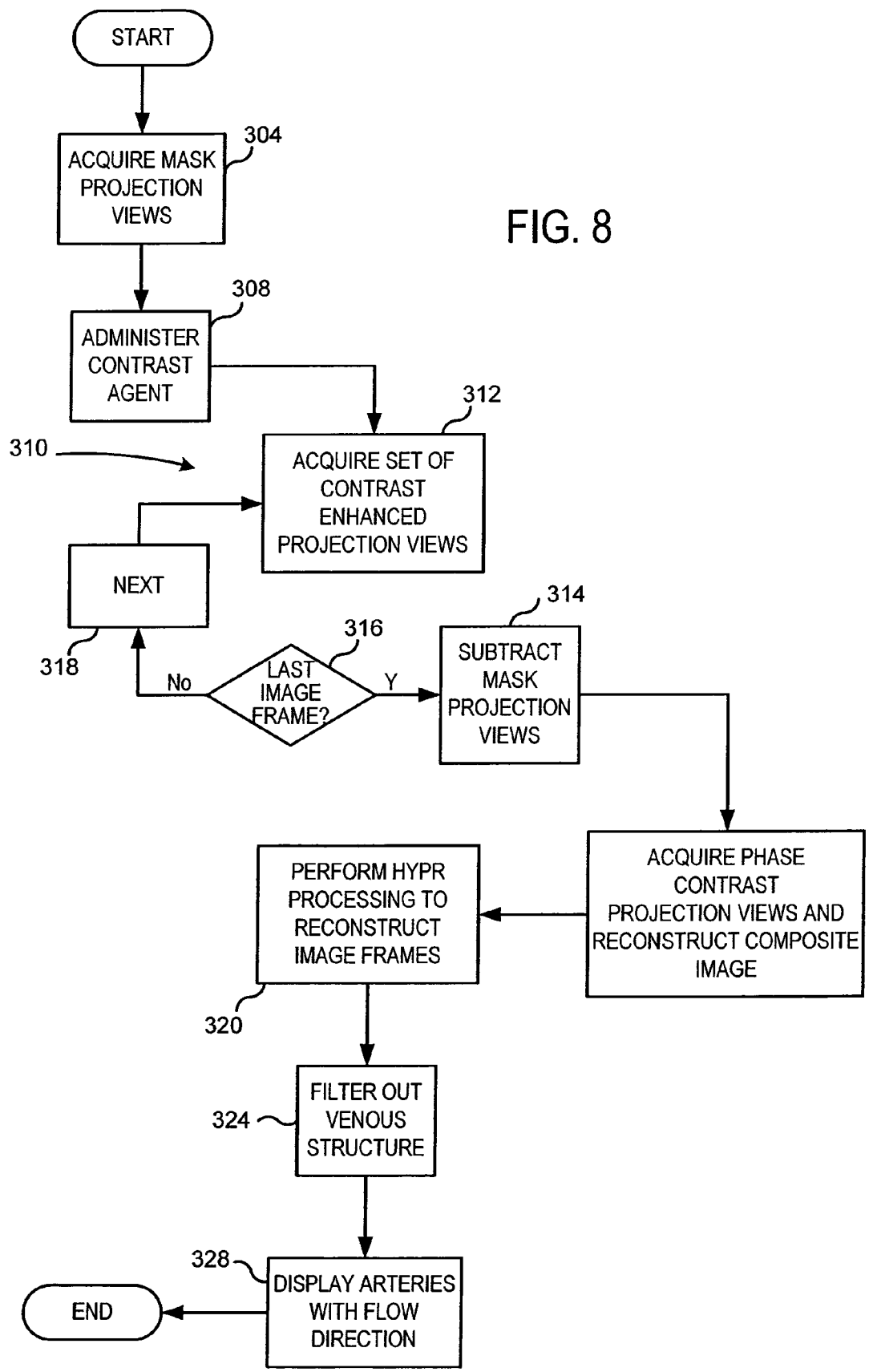
FIG. 8 is a flow chart of another preferred method.

In the alternative method disclosed in FIG. 8, the composite image is acquired and reconstructed at process block 300 after the dynamic study in which image frames are acquired. All of the steps in this alternative embodiment are performed the same as described above for FIG. 7 except the image reconstruction and processing in process blocks 320, 324 and 328 must be carried out after the dynamic study is completed. By acquiring the composite image after the dynamic study, however, contrast agent will be seen in venous structures as well as arteries. This further increases the SNR of the composite image which is passed on to the image frames by the HYPR image reconstruction process.

Yet another variation from the embodiments shown in FIGS. 7 and 8 and described above deals with subtraction of the background signals at process block 314. If a small residual background signal remains after subtraction of the mask views as described above, it may be necessary to also subtract the first image frame acquired after administration of the contrast from each of the subsequently acquired contrast enhanced image frames. Or, if the background is found to gradually fill with contrast during the study a small region of interest in the background may be identified and used to establish a background value that is maintained close to zero throughout the study.

Figure 14:
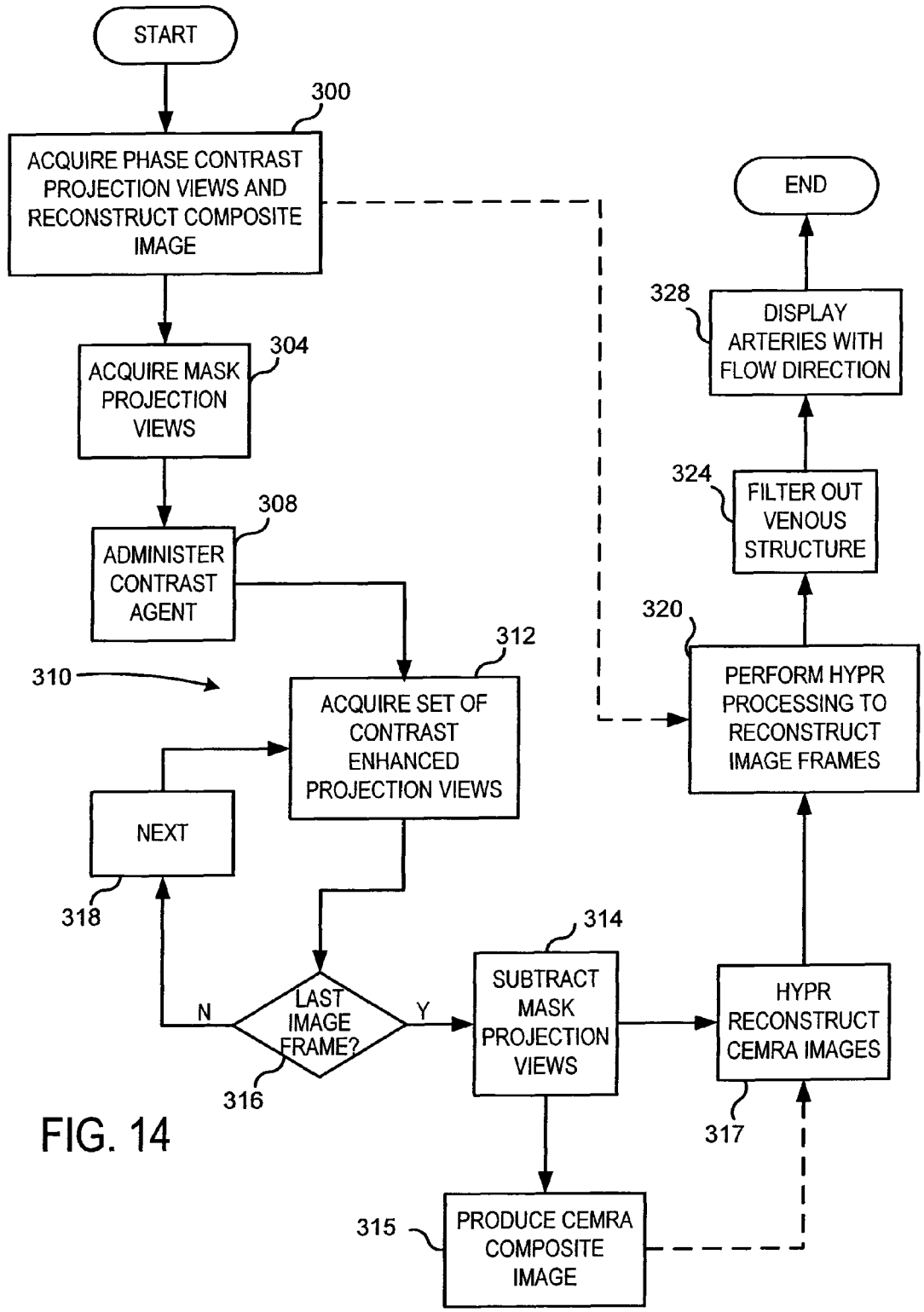
FIG. 14 is a flow chart of another alternative preferred method for employing the present invention in an MR imaging application.

Yet another embodiment of the invention is illustrated in FIG. 14. This is substantially the same as the embodiment shown in FIG. 7 and steps that are the same have been designated with the same reference numbers. The difference as indicated at process blocks 315 and 317 is that a further HYPR reconstruction step is added to the process. More particularly, a CEMRA composite image is produced as indicated at process block 315 from the subtracted projections in a plurality of the acquired image frames. Typically, the image frames used to produce this CEMRA composite image includes the current image frame being reconstructed plus image frames acquired during a time window centered about the current image frame. This is a conventional image reconstruction and the resulting CEMRA composite image is used in a HYPR reconstruction of each CEMRA image frame as indicated at process block 317. This step uses the HYPR reconstruction method shown in FIG. 12 and described above. Then, each of the CEMRA image frames is further HYPR processed as indicated by process block 320 to produce the final image frames. The HYPR method used in this step 320 is preferably that shown in FIG. 9 and described above. This embodiment produces image frames in which the background signals are substantially suppressed and a very clear depiction of vascular structures is shown.

The invention claimed is:

1. A method for producing a contrast enhanced image of a subject positioned in the field of view (FOV) of a magnetic resonance imaging (MRI) system, the steps comprising:
   a) acquiring with the MRI system a set of phase contrast views of the subject positioned in the FOV;
   b) reconstructing a phase contrast composite image from the phase contrast views which indicates a motion value at each composite image pixel of the subject positioned in the FOV;
   c) acquiring with the MRI system a set of mask views;
   d) acquiring with the MRI system a time frame data set comprised of an undersampled set of contrast enhanced views of the subject positioned in the FOV after the arrival of the contrast agent;
   e) repeating step d) to acquire a plurality of time frame data sets during the in flow of contrast agent into the FOV;
   f) subtracting mask views from the contrast enhanced views to obtain sparse contrast enhanced views for each time frame; and
   g) performing a highly constrained projection (HYPR) reconstruction to produce a contrast enhanced image of the subject for each time frame using both the sparse contrast enhanced views for the time frame and the phase contrast composite image.

2. The method of claim 1 in which the views acquired in steps c) and d) are projection views and wherein step g) includes:
   g)i) backprojecting each sparse contrast enhanced projection view in the set into the FOV and weighting the value backprojected into each image pixel by the value of the corresponding pixel in the phase contrast composite image; and
   g)ii) summing the backprojected values for each image pixel.

3. The method as recited in claim 2 in which step e) is performed prior to performing the HYPR reconstruction in step g).

4. The method as recited in claim 1 which includes:
   i) producing an updated composite image for each time frame using the reconstructed contrast enhanced image for that time frame; and
   j) performing another HYPR reconstruction to produce another contrast enhanced image of the subject for each time frame using the sparse contrast enhanced projection views for the time frame and the updated composite image for that time frame.

5. The method as recited in claim 4 in which step c) is performed by acquiring a set of mask views of the subject and step f) is performed by subtracting from each contrast enhanced view in said one set a mask view acquired at a same view angle.

6. The method as recited in claim 5 which includes repeating steps d) and e) to reconstruct a plurality of CEMRA images and subtracting one of the CEMRA images from the remaining CEMRA images to suppress background signal therein.

7. The method as recited in claim 5 which further includes:
   h) reconstructing a CEMRA composite image using a plurality of sets of contrast enhanced views acquired in step d);
   i) performing a HYPR reconstruction using the set of sparse contrast enhanced views and information in the CEMRA composite image to produce the information in the set of sparse contrast enhanced views used in step g).

8. The method as recited in claim 7 in which step i) includes:
   i)1) backprojecting each sparse contrast enhanced view in the set into a field of view (FOV) and weighting the value backprojected into each image pixel by the value of the corresponding pixel in the CEMRA composite image; and
   i)2) summing the backprojected values for each image pixel.

9. The method as recited in claim 7 in which step g) includes:
   g)1) producing a filtered weighting image from the information in the set of sparse contrast enhanced views and information in a motion encoded composite image; and
   g)2) multiplying the filtered weighting image by the motion encoded composite image.

10. The method as recited in claim 7 which includes:
    j) subtracting the contrast enhanced image for the first time frame acquired in step d) from the subsequent contrast enhanced images produced in step g).

11. The method as recited in claim 1 in which step g) includes:
    g)i) producing a normalized weighting image by filtering an image frame produced from the sparse contrast enhanced views and dividing it by a filtered phase contrast composite image; and
    g)ii) multiplying the normalized weighting image by the phase contrast composite image.

12. The method as recited in claim 11 in which the image frame and the phase contrast composite image are filtered before the division.

13. The method as recited in claim 11 in which the image frame and the phase contrast composite image are filtered after the division.

14. The method as recited in claim 1 in which steps a) and b) are performed before steps d) and e).

15. The method as recited in claim 1 in which steps a) and b) are performed after steps d) and e).

16. The method as recited in claim 1 in which the views acquired in steps c) and d) are radial projection views acquired at corresponding view angles.

17. The method as recited in claim 1 which further includes:
    h) acquiring a contrast enhanced mask image of the subject with the MRI system at a time when contrast is not present; and
    i) removing stationary structures from the CEMRA image by subtracting information in the mask image.

18. A method for reconstructing a contrast enhanced magnetic resonance angiographic (CEMRA) image with a magnetic resonance imaging (MRI) system, the steps comprising:
    a) acquiring a composite image of a subject with the MRI system which indicates at least a portion of a vasculature of the subject;
    b) acquiring a plurality of sets of contrast enhanced views of the subject with the MRI system; and
    c) reconstructing the CEMRA image using both information in one of the sets of contrast enhanced views and information in the composite image in a highly constrained projection (HYPR) reconstruction.

* * * * *